(12) United States Patent
Elsasser et al.

(10) Patent No.: US 10,973,157 B2
(45) Date of Patent: Apr. 6, 2021

(54) PRINTED CIRCUIT CARD ASSEMBLY CONNECTABLE TO A SERVER CHASSIS

(71) Applicant: International Business Machines Corporation, Armonk, NY (US)

(72) Inventors: Ryan Elsasser, Poughkeepsie, NY (US); Michael T. Peets, Staatsburg, NY (US); Lannie R. Bolde, Ulster Park, NY (US); David C. Olson, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,172

(22) Filed: Oct. 29, 2018

(65) Prior Publication Data
US 2020/0137933 A1    Apr. 30, 2020

(51) Int. Cl.
*H05K 9/00* (2006.01)
*H05K 7/14* (2006.01)

(52) U.S. Cl.
CPC ......... *H05K 9/0062* (2013.01); *H05K 7/1427* (2013.01); *H05K 7/1461* (2013.01); *H05K 9/0016* (2013.01)

(58) Field of Classification Search
CPC .. H05K 7/1407; H05K 7/1402; H05K 7/1417; H05K 7/1461; H05K 7/1424; H05K 7/1425; H05K 7/1427; H05K 7/1428; H05K 7/1429; H05K 7/1431; H05K 7/1432; H05K 7/1434; H05K 7/1435; H05K 9/0062
See application file for complete search history.

(56) References Cited

U.S. PATENT DOCUMENTS

| 4,694,380 | A | * | 9/1987 | Mallory | H05K 7/1409 361/816 |
| 5,491,613 | A | | 2/1996 | Petitpierre | |
| 5,993,227 | A | * | 11/1999 | Hsia | H05K 5/0295 439/159 |

(Continued)

FOREIGN PATENT DOCUMENTS

EP    1052887 A2    11/2000

OTHER PUBLICATIONS

EMI Shielding Engineering Handbook—Chomerics, Nov. 2000.

*Primary Examiner* — Rockshana D Chowdhury
*Assistant Examiner* — Douglas R Burtner
(74) *Attorney, Agent, or Firm* — Patterson + Sheridan, LLP (57) ABSTRACT

A cassette for insertion and removal of an edge-connected printed circuit card connectable to a server chassis is disclosed. The cassette includes a housing comprising a bottom wall having at least one elongated slot and a catch formed thereon. The cassette further includes a connector sub-assembly overlying the bottom wall having an edge connector socket formed thereon and configured to receive the edge-connected printed circuit card. The cassette further includes a guide sub-assembly underlying the bottom wall having a spring latch formed thereon. The spring latch is operable in a first state to engage the catch to prevent movement of the connector sub-assembly and the guide sub-assembly relative to the housing. The spring latch is operable in a second state to clear the catch to permit the connector sub-assembly and the guide sub-assembly to slide in unison in the at least one elongated slot.

14 Claims, 9 Drawing Sheets

(56) References Cited

U.S. PATENT DOCUMENTS

| | | | |
|---|---|---|---|
| 6,406,322 B1* | 6/2002 | Barringer | G06F 1/184 |
| | | | 361/752 |
| 6,496,385 B1 | 12/2002 | Smithson et al. | |
| 6,542,384 B1 | 4/2003 | Radu et al. | |
| 6,618,270 B2 | 9/2003 | Babin et al. | |
| 6,709,276 B2 | 3/2004 | Barringer et al. | |
| 6,744,641 B2 | 6/2004 | Schnabel | |
| 6,816,383 B2* | 11/2004 | Barringer | H05K 7/1409 |
| | | | 174/365 |
| 7,054,166 B1 | 5/2006 | Helgenberg et al. | |
| 7,081,587 B1 | 7/2006 | Noolsey | |
| 7,215,536 B2* | 5/2007 | Hensley | H05K 9/0015 |
| | | | 174/358 |
| 9,063,705 B2* | 6/2015 | Howell | H05K 7/1405 |
| 2003/0043562 A1* | 3/2003 | Barringer | H05K 9/0062 |
| | | | 361/800 |
| 2003/0045155 A1* | 3/2003 | Barringer | H05K 7/1424 |
| | | | 439/377 |
| 2007/0087594 A1* | 4/2007 | Kosugi | H05K 7/1418 |
| | | | 439/92 |
| 2010/0254096 A1* | 10/2010 | Kim | G06F 1/185 |
| | | | 361/737 |
| 2010/0254100 A1* | 10/2010 | Kim | H05K 7/1461 |
| | | | 361/752 |
| 2010/0265679 A1* | 10/2010 | Van Der Mee | H05K 7/1407 |
| | | | 361/759 |
| 2018/0220544 A1* | 8/2018 | Wang | H05K 7/1402 |

* cited by examiner

1005
Provide a cassette having a housing comprising a bottom wall having at least one elongated slot and a catch formed thereon, the cassette further having an input/output (I/O) sub-assembly having a first portion overlying the bottom wall of the housing and a second portion underlying the bottom wall of the housing, the first portion having an edge connector socket formed thereon, the second portion having a spring latch formed thereon, the spring latch, in a first state, engaging the catch in a closed position to prevent movement of the I/O sub-assembly relative to the housing 1010
Operate the spring latch when in a second state to clear the catch to permit the I/O sub-assembly to slide in the at least one elongated slot from the closed position to an open position that permits access to the edge connector socket 1015
Compress an emi shield assembly against a back face of a front wall of the housing of the cassette when the I/O sub-assembly slides against the back face of the front wall

FIG. 10

PRINTED CIRCUIT CARD ASSEMBLY CONNECTABLE TO A SERVER CHASSIS

BACKGROUND

The present invention relates to a cassette for inserting and removing an edge-connected printed circuit card, and more specifically, to an edge-connected printed circuit card which plugs into a card connector located in the cassette, the card connector sliding into a locked position and the cassette plugged into a motherboard of a server chassis via a sliding motion.

The size of integrated circuits has been steadily shrinking, and as such, the number of integrated circuits that can fit onto plug-in printed circuit cards has also been steadily increasing. The packaging of printed circuit cards in tight spaces is a direct logical extension of increasing chip level circuit densities. It should be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, permits the operation of the circuit components at higher frequencies.

Moreover, it is likewise desirable to be able to easily insert and remove these printed circuit cards into connectors vertically into a motherboard disposed in very tight spaces. The insertion and removal operations are also provided as an important part of a "hot-pluggability" function which is desirable for "on the fly" repairs, replacements, maintenance and upgrades.

Further, since operating frequencies have been increasing and packaging densities have grown larger, the associated integrated circuits both within and adjacent to a particular circuit card need to be protected from electromagnetic interference (EMI). Electronic circuit packaging designs should thus also be compatible with structures and configurations that are employed to prevent the leakage of electromagnetic interference. To whatever extent possible, packaging designs should also include structures which contribute positively to the containment of electromagnetic interference.

SUMMARY

According to one embodiment of the present disclosure, a cassette for insertion and removal of an edge-connected printed circuit card connectable to a server chassis is provided. The cassette includes a housing comprising a bottom wall having at least one elongated slot and a catch formed thereon. The cassette further includes a connector sub-assembly overlying the bottom wall having an edge connector socket formed thereon and configured to receive the edge-connected printed circuit card. The cassette further includes a guide sub-assembly underlying the bottom wall having a spring latch formed thereon. The spring latch is operable in a first state to engage the catch to prevent movement of the connector sub-assembly and the guide sub-assembly relative to the housing. The spring latch is operable in a second state to clear the catch to permit the connector sub-assembly and the guide sub-assembly to slide in unison in the at least one elongated slot.

According to one embodiment of the present disclosure, a cassette for insertion and removal of an edge-connected printed circuit card connectable to server chassis is provided. The cassette includes a housing comprising a bottom wall having a first end, a second end, and a central section between the first end and the second end. A first slot is formed in the first end of the housing and a second slot is formed in the second end of the housing. A catch is formed in the central section of the housing. The cassette further includes a connector sub-assembly overlying the bottom wall and comprising a base having a first end, a central section, and a second end, the first end of the connector assembly having a first fastener hole formed in the connector sub-assembly for receiving a first fastener, the second end of the connector sub-assembly having a second fastener hole formed in the connector sub-assembly for receiving a second fastener. The connector sub-assembly further comprises an edge connector socket located on the base of the connector sub-assembly within the central section of the connector sub-assembly. The edge connector socket is configured to receive the edge-connected printed circuit card. The cassette further includes a guide sub-assembly disposed underlying the bottom wall and comprising a base having a first end, a central section, and a second end, the first end of the guide sub-assembly having a first fastener hole formed in the guide sub-assembly for securing the first fastener, the second end of the guide sub-assembly having a second fastener hole formed in the guide sub-assembly for securing the second fastener, and the central section of the guide sub-assembly having a spring latch formed in the guide sub-assembly, the spring latch operable in a first state to engage the catch in a closed position to prevent movement of the connector sub-assembly and the guide-sub assembly relative to the housing. The spring latch is operable in a second state to clear the catch to permit the connector sub-assembly and the guide sub-assembly to slide in the first and second slots of the base of the housing from the closed position to an open position that permits access to the edge connector socket.

According to one embodiment of the present disclosure, a method for permitting insertion and removal of an edge-connected printed circuit card to be connectable to server chassis is disclosed. The method comprises providing a cassette having a housing comprising a bottom wall having at least one elongated slot and a catch formed thereon, the cassette further having an input/output (I/O) sub-assembly having a first portion overlying the bottom wall of the housing and a second portion underlying the bottom wall of the housing, the first portion having an edge connector socket formed thereon, the second portion having a spring latch formed thereon, the spring latch, in a first state, engaging the catch in a closed position to prevent movement of the I/O sub-assembly relative to the housing. The method further comprises operating the spring latch when in a second state to clear the catch to permit the I/O sub-assembly to slide in the at least one elongated slot from the closed position to an open position that permits access to the edge connector socket.

DETAILED DESCRIPTION

Embodiments of the present disclosure provide a cassette for insertion and removal of an edge-connected printed circuit card and for plugging into and removing from a motherboard of a server chassis. More particularly, embodiments provide a slide-loaded, self-latching universal Peripheral Component Interconnect Express (PCIE) cassette. The edge-connected printed circuit card plugs into a card connector located in the PCIE cassette in a direction that is normal to a cassette-server insertion motion, the card connector sliding into a locked position and the cassette plugged into a motherboard of the server chassis via a sliding motion. This card connector, called an interposer card, is slid into a locked position and then the cassette is vertically plugged into the server chassis containing other printed circuit cards via a sliding motion. The PCIE cassette incorporates semi-precise and precise guidance between the edge-connected printed circuit card and the server chassis. Embodiments also provide for continuous EMI shielding via an EMI shield/gasket assembly that has fan fold and leaf spring geometry, and that is locked in compression against a housing of the cassette via a slide-loading mechanism. The PCIE cassette provides structural support to the edge-connected printed circuit card for easy insertion and removal of the edge-connected printed circuit card to/from the motherboard, as well as thermal and electrical isolation from other edge-connected printed circuit cards and components within the server chassis.

Figure 1:
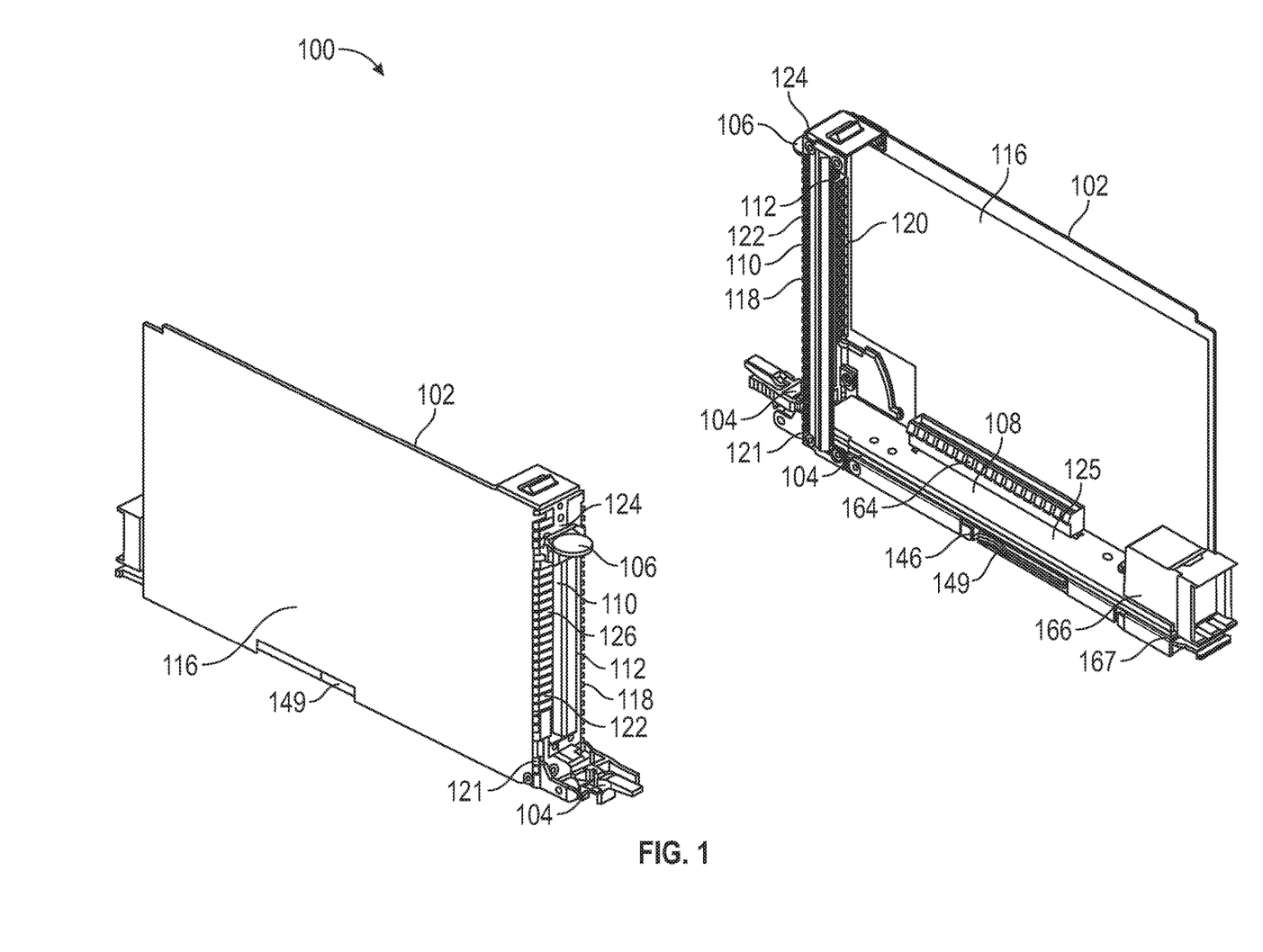
FIG. 1 shows a front perspective view and a back perspective view of an edge-connected printed circuit card cassette for insertion and removal from a server chassis is shown, in accordance with an embodiment.

FIG. 1 shows a front perspective view and a back perspective view of an edge-connected printed circuit card cassette 100 for insertion and removal from a server chassis 230 (see FIG. 4), in accordance with an embodiment. The cassette 100 includes a housing 102, a first latch 104, a second latch 106, an input/output (I/O) assembly 108, and an EMI shield assembly 110. The housing 102 includes a front wall 112, a bottom wall 114, and a side wall 116. The front wall 112 has a front face 118 and a back face 120. The front face 118 has a lower end 121, a central section 122, and an upper end 124. The first latch 104 is disposed at the lower end 121 of the front face 118. The first latch 104 is configured to permit the removal and insertion of the cassette 100 into and out of the server chassis 230 and to secure the cassette 100 to the server chassis 230. The central section 122 includes an opening 126 for receiving I/O connectors of an edge-connected printed circuit card 270 to be installed within the cassette 100. The second latch 106 permits engagement/disengagement of the edge-connected printed circuit card 270 and to provide a locking feature by ensuring that the edge-connected printed circuit card 270 plugged into the cassette 100 is pressed firmly against the front wall 112 of the housing 102. The back face 120 of the front wall 112 is configured to engage and retract from an EMI shield assembly 110 that is pressed against or removed from the back face 120 of the front wall 112 by the edge-connected printed circuit card 270 (see FIG. 8) plugged into an edge connector socket 164 disposed on a central portion 125 the input/output (I/O) assembly 108.

The bottom wall 114 of the housing 102 further includes a catch 146 that is operable to engage/disengage a spring latch 149 located in the input/output (I/O) assembly 108. When the spring latch 149 is operated by pushing it inward toward the cassette 100, the spring latch 149, previously blocked from movement when engaging the catch 146, clears the catch 146 to permit the housing 102 of the cassette 100 to slide freely relative to the input/output (I/O) assembly 108.

Figure 2:
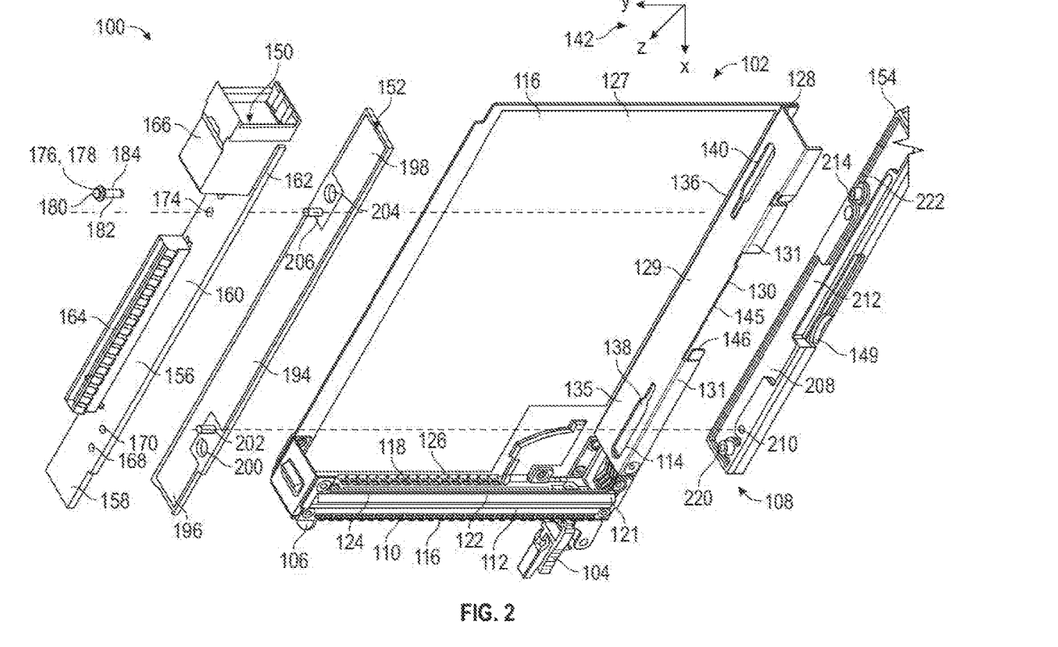
FIG. 2 shows an exploded view of the edge-connected printed circuit card cassette of FIG. 1, in accordance with an embodiment.

In one embodiment, the edge connector socket 164 is a PCIE edge connector socket. A PCIE input/output male socket 166 is disposed on an end 167 input/output (I/O) assembly 108 In one embodiment, the PCIE input/output male socket 166 connects to a corresponding female connector 240 located at the back of the server chassis 230. The PCIE input/output male socket 166 transfers input and output signals to and from a bus system (e.g. PCIE) located in the server chassis 230 (see FIGS. 4 and 5). FIG. 2 shows an exploded view of the edge-connected printed circuit card cassette 100 of FIG. 1, in accordance with an embodiment. The input/output (I/O) assembly 108 includes a plurality of elongated sub-assemblies 150, 152, 154 alignable with each other and the housing 102 of the cassette 100. The sub-assemblies 150, 152, 154 are stackable above and below the bottom wall 114 of the housing 102. The input/output (I/O) assembly 108 includes a connector sub-assembly 150, a spacer sub-assembly 152, and a guide sub-assembly 154. The connector sub-assembly 150 is disposed overlying and aligned with the spacer sub-assembly 152. The spacer sub-assembly 152 is disposed overlying and aligned with the bottom wall 114 of the housing 102. The guide assembly 154 is disposed underlying and aligned with the bottom wall 114 of the housing 102.

The side wall 116 of the housing 102 has an upper section 127 disposed overlying the bottom wall 114 of the housing 102 and a lower section 128 located underlying the bottom wall 114 of the housing 102. The connector sub-assembly 150 and the spacer sub-assembly 152 of the input/output (I/O) assembly 108 are further located adjacent to the upper section 127 of the side wall 116. The is configured to receive the guide sub-assembly 154 of the input/output (I/O) assembly 108 are further located adjacent the lower section 128 of the side wall 116.

The bottom wall 114 of the housing 102 has an upper surface 129, a lower surface 130, and a side surface 131 extending from the upper surface 129. The lower surface 130 and the side surface 131, together with the lower section 128 of the side wall 116, form an interior space 133 for receiving the guide sub-assembly 154. The bottom wall 114 has a first end 135 and a second end 136. A first elongated slot 138 is disposed proximal the first end 135 and a second elongated slot 140 is disposed proximal to the second end 136 in a spaced apart relationship with the first elongated slot 138. The elongated slot 138 is disposed proximal to the side wall 116 and the elongated slot 140 is disposed distal to the side wall 116.

The bottom wall 114 and the elongated slots 138, 140 define an axis of elongation 142 of the cassette 100, wherein the axis of elongation 142 indicates a direction of motion of the cassette 100 into and out of the computer system chassis as well as the movement of the bottom wall 114 relative to the input/output (I/O) assembly 108. Put another way, the elongated slots 138, 140 provide guidance for the input/output (I/O) assembly 108. The side surface 131 of the bottom wall 114 has an opening 145 located about half way between the first end 135 and the second end 136 of bottom wall 114 between the elongated slots 138, 140. The opening 145 has the catch 146 at one end and is operable to engage/disengage the spring latch 149 located in the guide sub-assembly 154.

The connector sub-assembly 150 (interposer card) has a base 156 having a first end 158, a central section 160, and a second end 162. The edge connector socket 164 is disposed on the base 156 within the central section 160. 270. The PCIE input/output male socket 166 is disposed on the second end 162 of the base 156.

The first end 158 of the base 156 further includes a first fastener hole 168 and a first locating pin hole 170 disposed adjacent to one end of the edge connector socket 164, while the second end 162 further includes a second fastener hole 172 and a second locating pin hole 174 disposed between the edge connector socket 164 and to the PCIE input/output male socket 166. The first and second fastener holes 168, 172 receive a corresponding first fastener 176 and a second fastener 178, respectively. The first and second fastener holes 168, 172 are aligned with the first and second slots 138, 140 in the bottom wall 114 of the cassette 100.

The first and second fasteners 176, 178 each include a head 180, a central shoulder/shaft 182, and threaded ends 184. The head 180 provides a stop to the insertion of the fasteners 176, 178 against the base 156. The shaft 182 passes through corresponding through-holes 200, 204 in the spacer sub-assembly 152, thence through the elongated slots 138, 140 in the bottom wall 114 of the housing 102, and secured in corresponding sockets 188, 190 in the guide sub-assembly 154. The height of the head 180 to a base 192 of the guide sub-assembly 154 is slightly greater than the combined height of the input/output (I/O) assembly 108 to permit a clearance for the input/output (I/O) assembly 108 to slide freely relative to the bottom wall 114 of the housing 102 when the spring latch 149 is depressed/activated within the guide sub-assembly 154. Put another way, the clearance provided by the height of the fasteners 176 fastened to the connector sub-assembly 150 relative to the fasteners 176 secured to the base 208 of the guide sub-assembly 154. The combined height of connector sub-assembly 150 overlying the guide sub-assembly 154 including the bottom wall 114 of the housing 102 is greater than the height of the connector sub-assembly 150 overlying the guide sub-assembly 154 alone.

The spacer sub-assembly 152 has a base 194 having a first end 196 and a second end 198. The first end 196 of the base 194 includes a first fastener hole 200 formed therein and a first locating pin 202 extending from the base 194, while the second end 198 includes a second fastener hole 204 and a second locating pin 206. The first and second fastener holes 200, 204 are configured to receive the corresponding first fastener 176 and the second fastener 178. The first and second fastener holes 200, 204 are aligned with the first and second slots 138, 140 in the bottom wall 114 of the cassette 100. The locating pins 202, 206 extend into the first and second locating pin holes 170, 174 in the base 156 of the connector sub-assembly 150. The locating pins 202, 206 align the connector sub-assembly 150 with the spacer sub assembly 152.

The guide sub-assembly 154 disposed underlying and aligned with the bottom wall 114 of the housing 102 includes a base 208 having a first end 210, a central section 212, and a second end 214. The guide sub-assembly 154 further includes a top side 216 and a bottom side 218. A first threaded fastener hole 220 is disposed in the first end 210 and a second threaded fastener hole 222 is disposed in the second end 214. The first and second threaded receiving holes 220, 222 receive and secure the threaded ends 184 of the first and second fasteners 176, 178 in the base 208.

Figure 3:
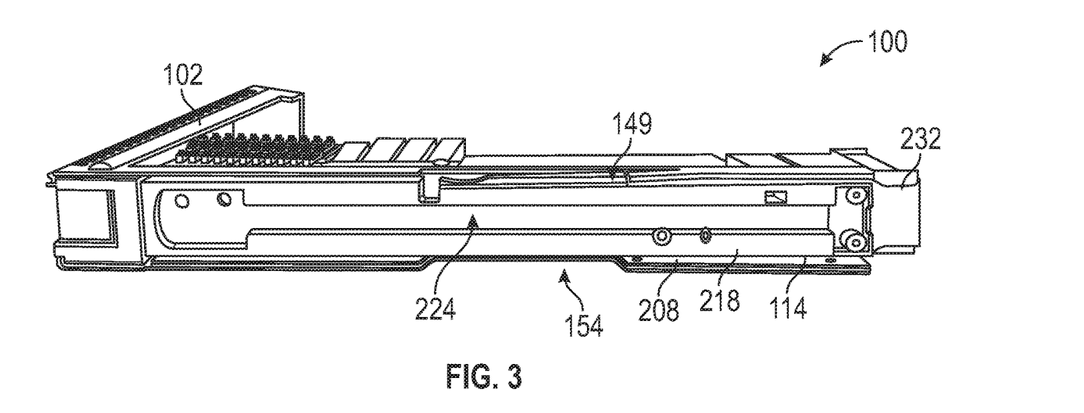
FIG. 3 shows the guide sub-assembly of the cassette disposed underlying and aligned with the bottom wall of the housing of the cassette.

FIG. 3 shows the guide sub-assembly 154 of the cassette 100 disposed underlying and aligned with the bottom wall 114 of the housing 102 of the cassette 100. The bottom side 218 of the base 208 of the guide sub-assembly 154 includes the spring latch 149 disposed in the central section 212. An elongated female rough guidance slot 224 is disposed along the length of the bottom side 218 of the base 208 to provide rough guidance of the cassette 100 along a corresponding male rough guidance fin 226 located on the motherboard 228 of the server chassis 230 (See FIG. 4).

Figure 4:
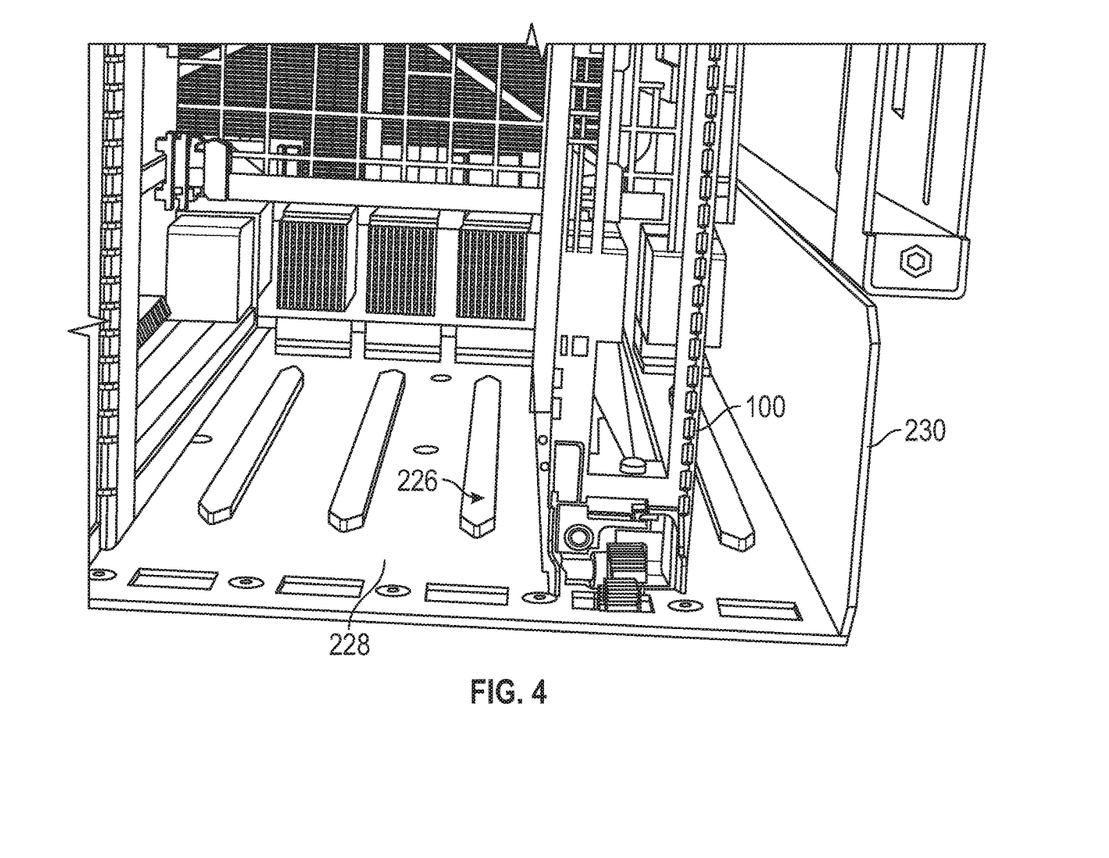
FIG. 4 shows the back side of a server chassis having a motherboard with a plurality of male rough guidance fins located on the motherboard and the cassette disposed on one of the male rough guidance fins inside the server chassis.

FIG. 4 shows the back of a server chassis 230 having a motherboard 228 with a plurality of male rough guidance fins 226 located on the motherboard 228 and the cassette 100 disposed on one of the male rough guidance fins 226 inside the server chassis 230.

Figure 5:
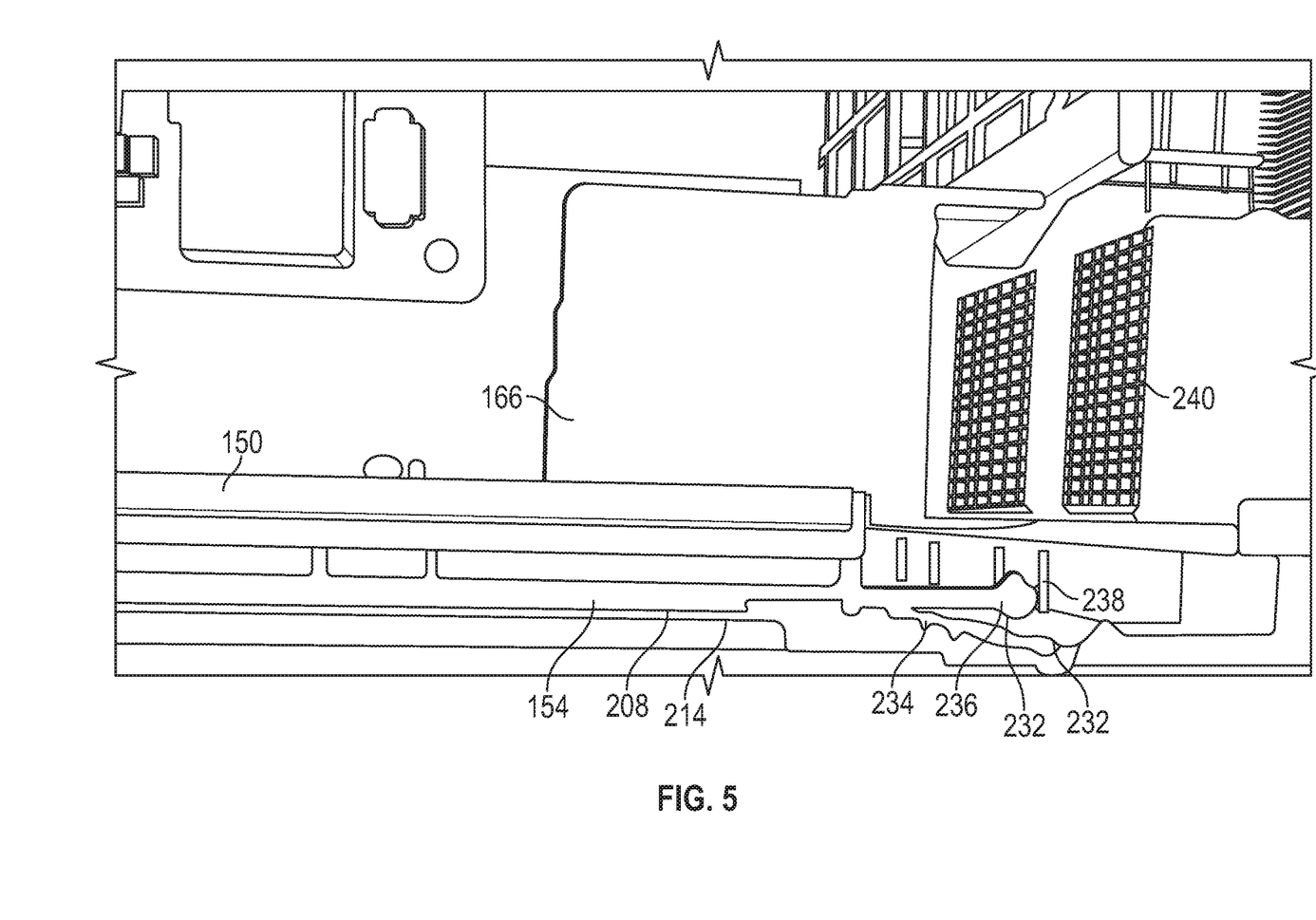
FIG. 5 shows a fine guidance structure of the cassette that affixes the chassis to slots in the back of the server chassis.

FIG. 5 shows a fine guidance structure of the cassette that affixes the chassis to slots in the back of the server chassis. The guide sub-assembly 154 further includes a pair of fine guidance pins 232 extending from the second end 214 of the base 208. Each fine guidance pin 232 includes a shaft 234 and a head 236 extending from the shaft 234. The fine guidance pins 232 secure the cassette 100 firmly to corresponding slots 238 underlying the female connectors 240 located at the back of the server chassis 230 and also provide guidance for the PCIE input/output male socket 166 located on the connector sub-assembly 150 (interposer card) to mate with a corresponding female connector 240 located at the back of the server chassis 230.

Figure 6:
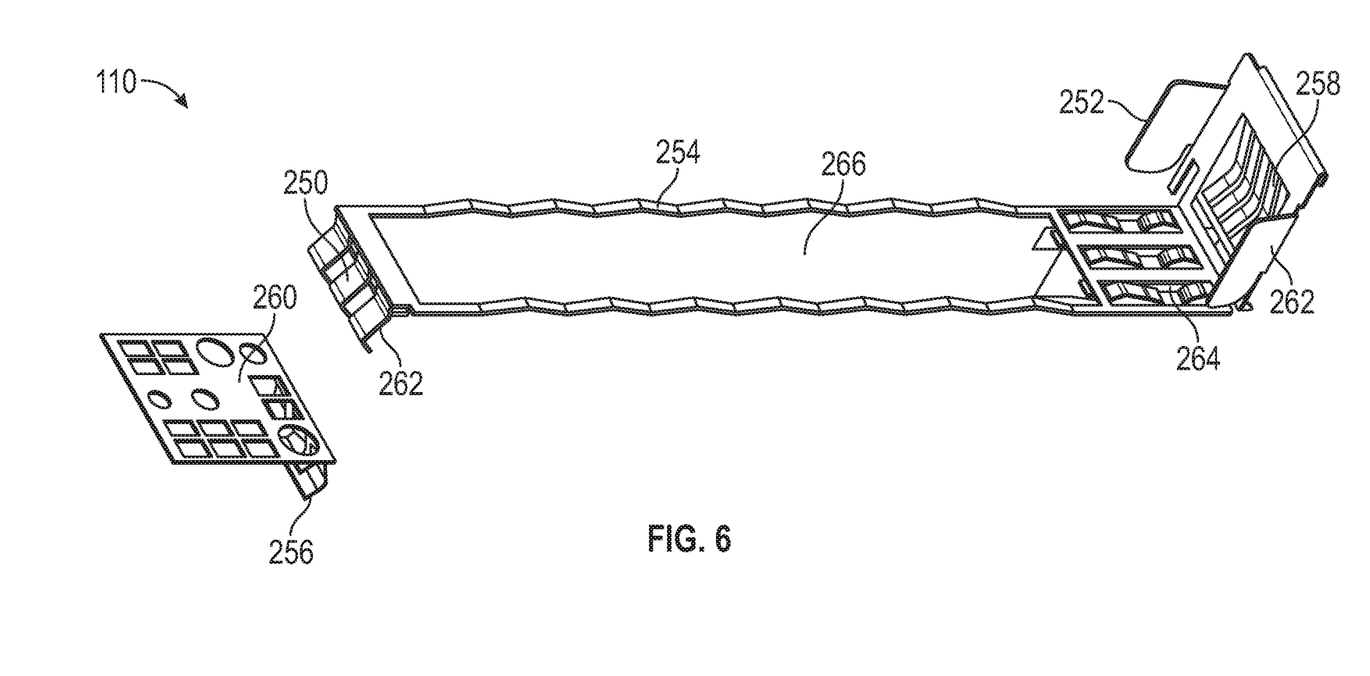
FIG. 6 is an exploded perspective view of an EMI shield assembly of the cassette.

FIG. 6 is an exploded perspective view of an EMI shield assembly 110 of the cassette 100. The EMI shield assembly 110 is configured to be coupled to the front wall 112 of the housing 102 and includes an upper EMI gasket 250 and a lower EMI gasket 252. A tail-stock 254 connects the upper EMI gasket 250 to the lower EMI gasket 252. Each of the EMI gaskets 250, 252 has a spring finger geometry that comprises spring fingers 256, 258 and slots 260, 261 for connection to spring fingers 262, 264 located at corresponding ends of the tail-stock 254. The tail-stock 254 has a fanfold geometry with a central space 266.

Figure 7:
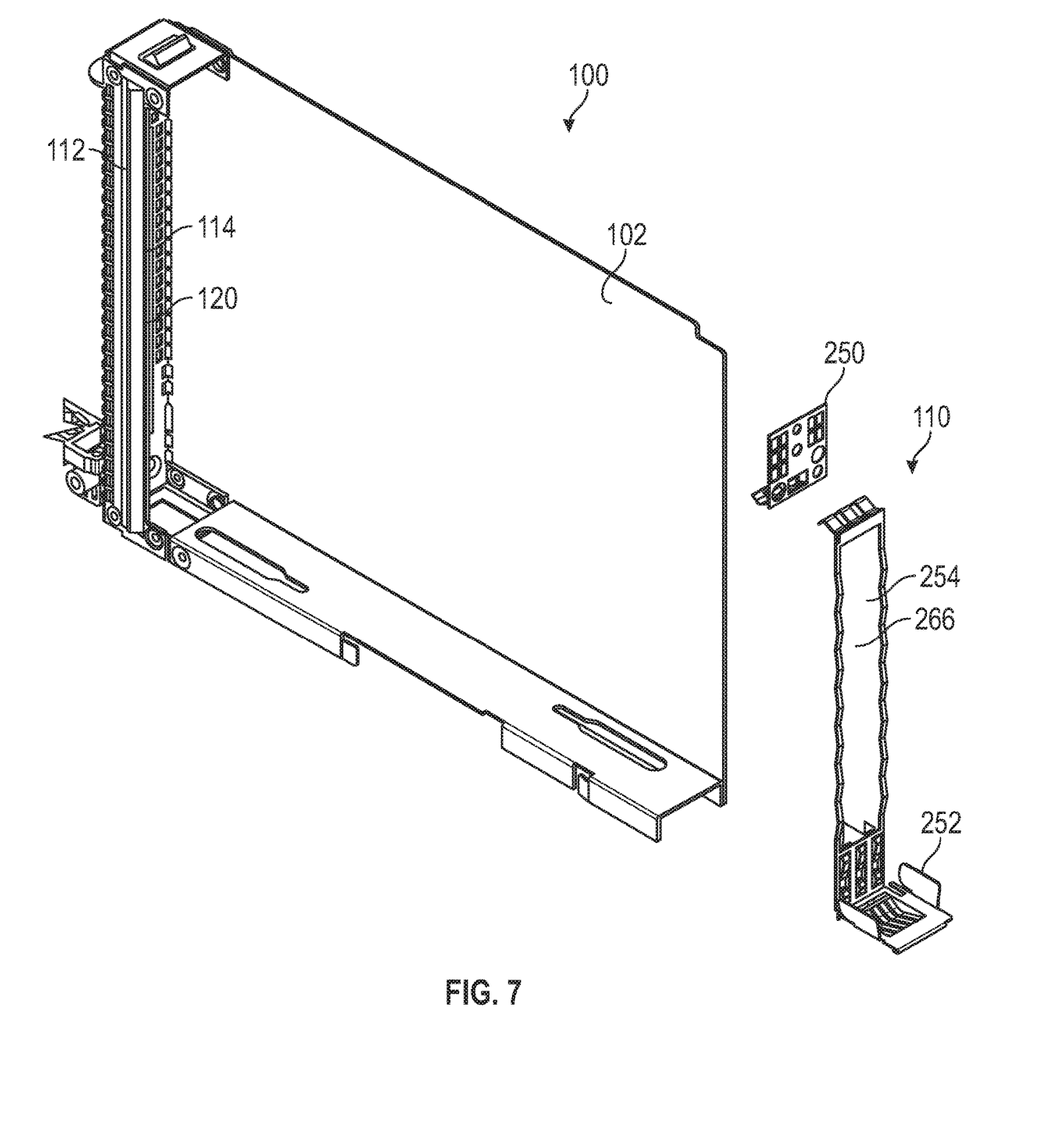
FIG. 7 shows how the EMI shield assembly of FIG. 6 fits into the cassette.

FIG. 7 shows how the EMI shield assembly 110 of FIG. 6 fits into the cassette 100. The spring finger/fanfold geometry of the EMI shield assembly 110 is sized and shaped to cover any openings in the back face 120 of the front wall 112 of the housing 102 of the cassette 100 when the EMI shield assembly 110 is compressed against the housing 102. The fanfold geometry creates a kind of a Faraday cage around front wall 112 of the housing 102 to prevent electromagnetic radiation to enter/exit from the cassette 100. The spring finger geometry of the upper and lower EMI gaskets 250, 252 interface with the tail-stock (not shown) of the cassette 100. The central space 266 in the tail-stock 254 provides for air flow to/from the cassette 100.

The cassette 100 is operable to provide two sliding operations: (1) a sliding motion of input/output (I/O) assembly 108 relative to the housing 102 of the cassette 100 needed to provide access to an edge-connected printed circuit card 270 for plugging and removing the edge-connected printed circuit card 270 into and out of the edge connector socket 164 located in the input/output (I/O) assembly 108 and, (2) pushing the cassette 100 into and pulling the cassette 100 out of the server chassis 230.

To implement sliding action (2), the cassette 100 is provided with a female rough guidance slot 224 on an underside of the guide sub-assembly 154 of the cassette 100 for mating with a corresponding male rough guidance fin 226 located on the motherboard 228 of the server chassis 230 using a sliding motion into the server chassis 230. In order to install the cassette 100, the cassette 100 is slid into the male rough guidance fin 226 in the direction of the elongated axis of elongation 142 of the cassette 100 from left to right. Once the cassette 100 is fully slid onto the male rough guidance fin 226 on the motherboard 228, the cassette 100 is more or less aligned with other edge-connected printed circuit card 270 on the motherboard 228.

As noted above, the guide sub-assembly 154 of the cassette 100 further includes a pair of fine guidance pins 232 that provides for sliding of the cassette 100 to mate with the fine guidance pins 232 the corresponding slots 238 underlying the female connectors 240 located at the back of the server chassis 230.

To implement sliding action (1), the input/output (I/O) assembly 108 of the cassette 100 is configured to remain stationary while permitting the housing 102 of the cassette 100 to slide from an initial locked position to an unlocked position and back to a final locked position. FIG. 1 shows the relative locations of the components of the cassette 100 without a plugged-in, edge-connected printed circuit card 270 in the initial locked position. When in the first locked position, the input/output (I/O) assembly 108 of the cassette 100 is aligned with the bottom wall 114 of the housing 102 of the cassette 100. The EMI shield assembly 110 is free to move within the housing 102.

Figure 8:
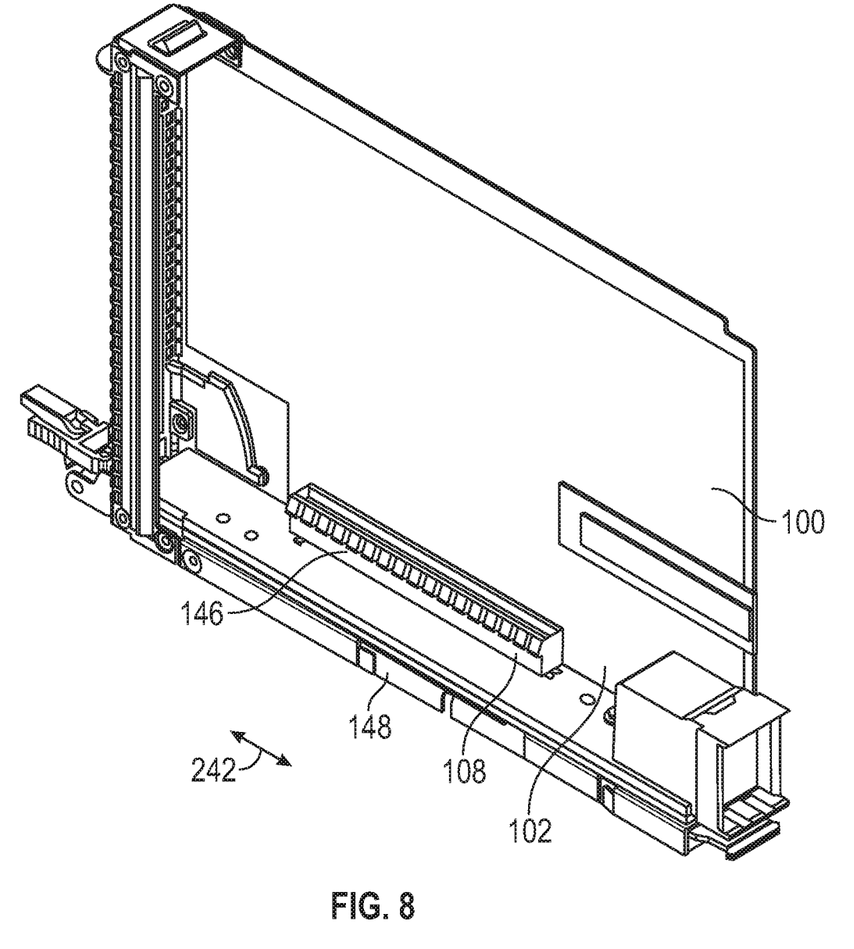
FIG. 8 shows the relative locations of the components of the cassette with the edge-connected printed circuit card plugged into the cassette in an unlocked position.

FIG. 8 shows the relative locations of the components of the cassette 100 with the edge-connected printed circuit card 270 plugged into the cassette 100 in the unlocked position. When in the unlocked position, the front wall 112 of the housing 102 slides in a leftward motion along the axis of elongation 142 away from the EMI shield assembly 110. The spring latch 148 is operated to clear the catch 146. As a result, access is provided to an edge-connected printed circuit card 270 that can be plugged into the edge connector socket 164 located in the input/output (I/O) assembly 108 and the EMI shield assembly 110 is disengaged from the front wall 112 of the housing 102 of the cassette 100.

Figure 9:
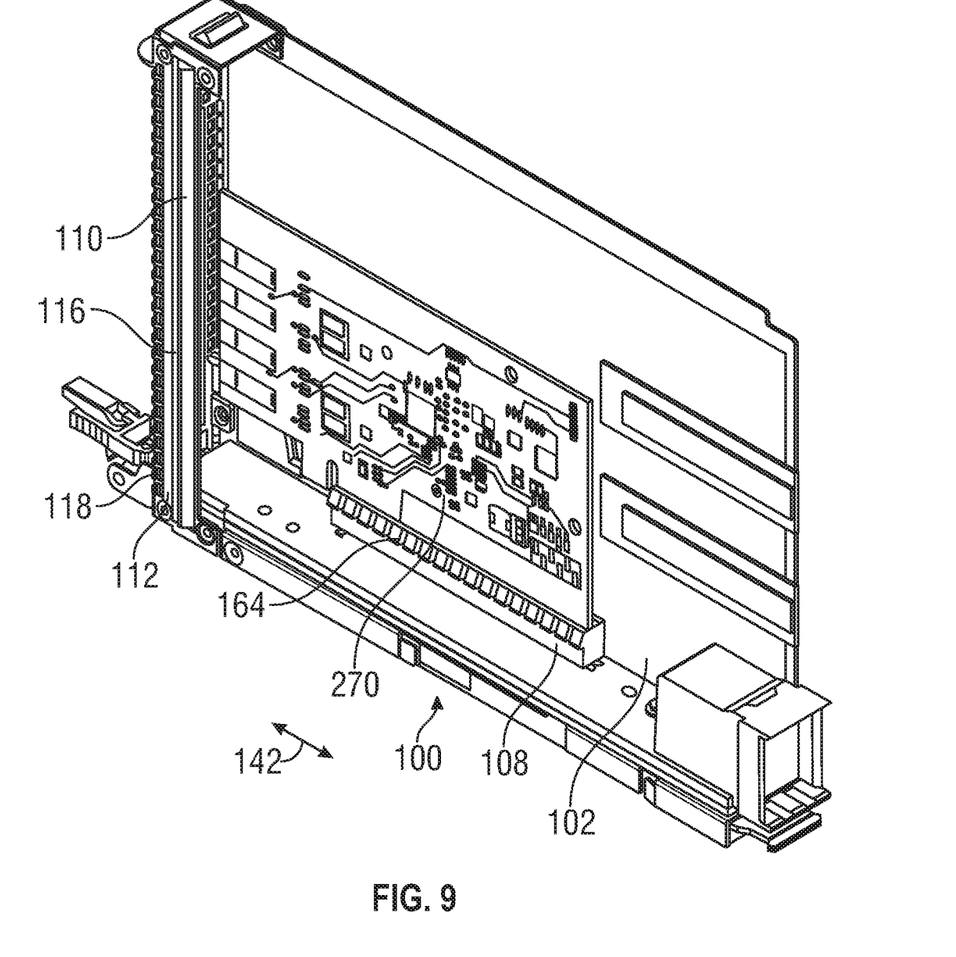
FIG. 9 shows the relative locations of the components of the cassette in a locked position.

FIG. 9 shows the relative locations of the components of the cassette 100 in the final locked position. When in the final locked position, the front wall 112 of the housing 102 slides in a rightward motion along the axis of elongation 142 toward from the EMI shield assembly 110 and the edge-connected printed circuit card 270 installed in the input/output (I/O) assembly 108. When the second latch 106 on the front face 118 of the f wall 116 of the housing 102 is turned, the edge-connected printed circuit card 270 in the edge connector socket 164 is pressed firmly against and secured to the housing 102. Further, the EMI shield assembly 110 is pressed firmly against the front wall 112 of the housing 102 of the cassette 100.

Sliding of input/output (I/O) assembly 108 relative to the housing 102 of the cassette 100 is permitted by the clearance provided by the height of the fasteners 176 fastened to the connector sub-assembly 150 relative to the fasteners 176 secured to the base 192 of the guide sub-assembly 154. The fastener 176 threaded through the fastener holes 168, 172 in the connector sub-assembly connector sub-assembly 150, through the fastener holes 200, 204 in the spacer sub-assembly 152, the elongated slots 138, 140 in the bottom wall 114 of the housing 102, and secured in the fastener holes 220, 222 in the guide sub-assembly 154 defines a combined height that is greater than the height of the connector sub-assembly 150 and the spacer sub-assembly 142 overlying the guide sub-assembly 154 alone, the combined height providing a clearance for the housing 102 to slide freely relative to the connector sub-assembly 150, the spacer sub-assembly 152, and the guide sub-assembly 154.

Figure 10:
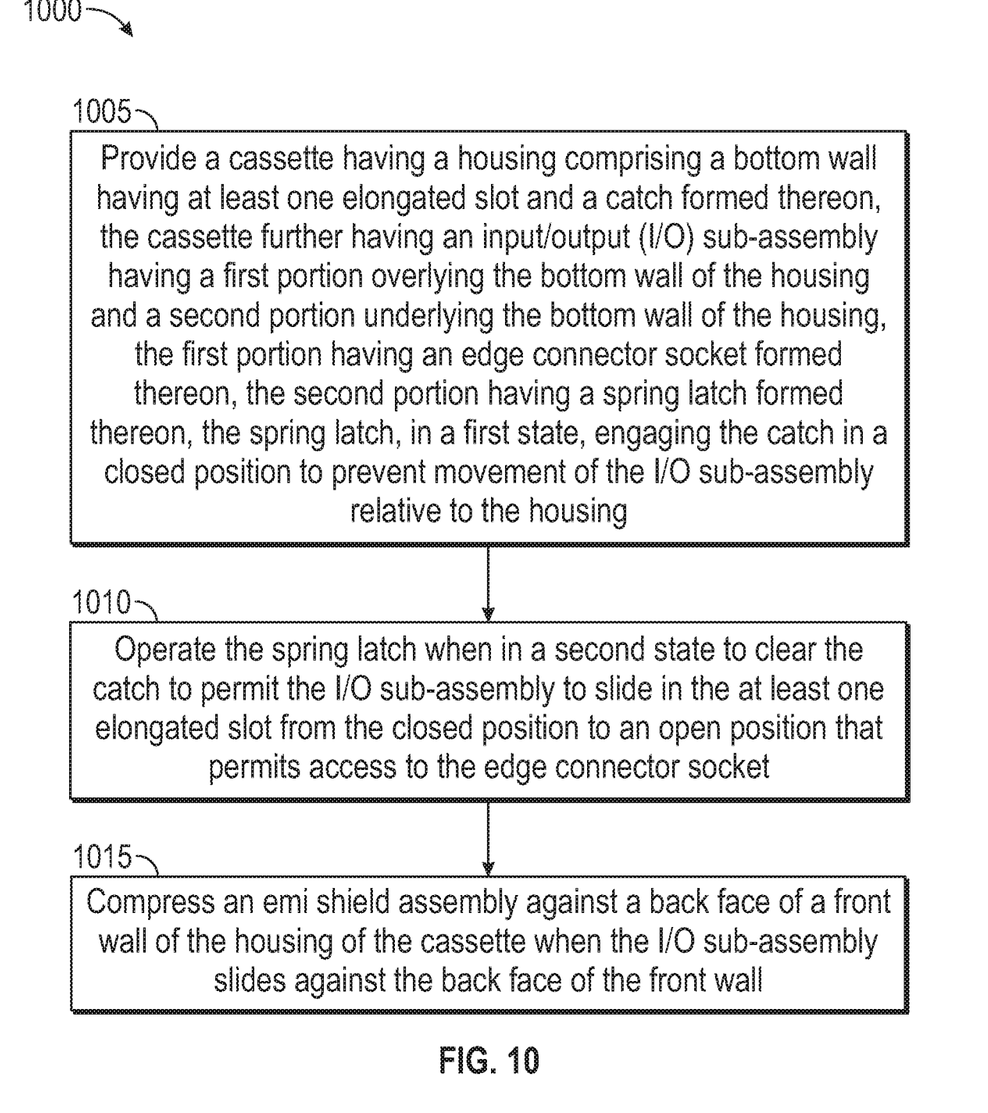
FIG. 10 is a flow chart illustrating one embodiment of a method for permitting insertion and removal of an edge-connected printed circuit card to be connectable to server chassis, according to one embodiment.

FIG. 10 illustrates one embodiment of a method 1000 for permitting insertion and removal of the edge-connected printed circuit card 270 to be connectable to server chassis 230. At block 1005, a cassette 100 having a housing 102 comprising a bottom wall 104 having at least one elongated slot 138, 140 and a catch 146 formed thereon is provided, the cassette 100 further having an input/output (I/O) sub-assembly 108 having a first portion overlying the bottom wall 114 of the housing 102 and a second portion underlying the bottom wall 114 of the housing 102, the first portion having an edge connector socket 164 formed thereon, the second portion having a spring latch 149 formed thereon, the spring latch, in a first state, engaging the catch 146 in a closed position to prevent movement of the I/O sub-assembly 108 relative to the housing 102. At block 1010, the spring latch 149 is operated when in a second state to clear the catch 146 to permit the I/O sub-assembly 108 to slide in the at least one elongated slot 138, 140 from the closed position to an open position that permits access to the edge connector socket 164. At block 1015, an EMI shield assembly 110 is compressed against a back face 120 of a front wall 112 of the housing 102 of the cassette 100 when the I/O sub-assembly 108 slides against the back face 120 of the front wall 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A cassette for insertion and removal of an edge-connected printed circuit card connectable to a server chassis, comprising:
   a housing comprising a bottom wall having an elongated slot and a catch formed thereon;
   a connector sub-assembly overlying the bottom wall and comprising a base having a first end, a central section, and a second end, wherein the connector sub-assembly includes a first fastener hole formed in the connector sub-assembly and configured to receive a fastener, and the second end of the connector sub-assembly includes a second fastener hole;
   a guide sub-assembly underlying the bottom wall having a spring latch formed thereon, the spring latch operable in a first state to engage the catch to prevent movement of the connector sub-assembly and the guide sub-assembly relative to the housing; and
   a spacer sub-assembly underlying the connector sub-assembly and overlying the bottom wall of the housing, the spacer sub-assembly having a third fastener hole and a locating pin extending therefrom, wherein the third fastener hole is configured to receive the fastener, wherein the locating pin is configured to align the connector sub-assembly with the spacer sub-assembly, and wherein the spring latch is operable in a second state to clear the catch to permit the connector sub-assembly and the guide sub-assembly to slide in unison in the elongated slot.

2. The cassette of claim 1, wherein the guide sub-assembly further comprises one fastener hole formed in the guide sub-assembly for being secured to the fastener through the first fastener hole and the fastener passing through the elongated slot in the housing.

3. The cassette of claim 1, wherein the at least one fastener threaded through the first hole in the connector sub-assembly and the at least one hole in the spacer sub-assembly, the elongated slot in the bottom wall, and in at least one fastener hole in the guide sub-assembly define a combined height that is greater than a height of the connector sub-assembly and the spacer sub-assembly overlying the guide sub-assembly alone, the combined height providing a clearance for the housing to slide freely relative to the connector sub-assembly, the spacer sub-assembly, and the guide sub-assembly.

4. The cassette of claim 1, further comprising at least one fastener threaded through the first fastener hole in the connector sub-assembly, the elongated slot in the bottom wall, and secured in at least one fastener hole in the guide sub-assembly,
   wherein, when the spring latch is operated, the spring latch clears the catch to permit connector sub-assembly and the guide sub-assembly to slide in unison in the elongated slot relative to the housing and guided by the at least one fastener.

5. A cassette for insertion and removal of an edge-connected printed circuit card to and from a server chassis, comprising:
   a housing comprising a bottom wall having a first end, a second end, and a central section between the first end and the second end, wherein a first slot is formed in the first end of the housing and a second slot is formed in the second end of the housing, and wherein a catch is formed in the central section of the housing;
   a connector sub-assembly overlying the bottom wall and comprising a base having a first end, a central section, and a second end, the first end of the connector sub-assembly having a first fastener hole formed in the connector sub-assembly for receiving a first fastener, the second end of the connector sub-assembly having a second fastener hole formed in the connector sub-assembly for receiving a second fastener, the connector sub-assembly further comprising an edge connector socket located on the base of the connector sub-assembly within the central section of the connector sub-assembly, the edge connector socket configured to receive the edge-connected printed circuit card; and
   a guide sub-assembly disposed underlying the bottom wall and comprising a base having a first end, a central section, and a second end, the first end of the guide sub-assembly having a first fastener hole formed in the guide sub-assembly for securing the first fastener, the second end of the guide sub-assembly having a second fastener hole formed in the guide sub-assembly for securing the second fastener, and the central section of the guide sub-assembly having a spring latch formed in the guide sub-assembly, the spring latch operable in a first state to engage the catch in a closed position to prevent movement of the connector sub-assembly and the guide sub-assembly relative to the housing,
   wherein the spring latch is operable in a second state to clear the catch to permit the connector sub-assembly and the guide sub-assembly to slide in the first and second slots of the base of the housing from the closed position to an open position that permits access to the edge connector socket.

6. The cassette of claim 5, further comprising a spacer sub-assembly underlying the connector sub-assembly and overlying the bottom wall of the housing, the spacer sub-assembly having a first fastener hole formed in the spacer sub-assembly and a second fastener hole formed in the spacer sub-assembly, and at least one locating pin formed in the spacer sub-assembly and extending therefrom, the first fastener hole formed in the spacer sub-assembly and the second fastener hole formed in the spacer sub-assembly configured to receive the first fastener and the second fastener, the at least one locating pin formed in the spacer sub-assembly to align the connector sub-assembly with the spacer sub-assembly.

7. The cassette of claim 5, wherein the guide sub-assembly further comprises an elongated female rough guidance slot located along a length of a bottom side of guide sub-assembly to provide rough guidance of the cassette along a corresponding male rough guidance fin located on a motherboard of the server chassis.

8. The cassette of claim 1, wherein the housing includes a bottom wall having a first end, a second end, and a central section between the first end and the second end, wherein the elongated slot is formed in the first end of the housing, a second slot is formed in the second end of the housing, and the catch is formed in the central section of the housing.

9. The cassette of claim 1, wherein the connector sub-assembly includes an edge connector socket.

10. The cassette of claim 9, wherein edge connector socket is positioned on the base of the connector sub-assembly.

11. The cassette of claim 9, wherein the edge connector socket is positioned within the central section the connector sub-assembly.

12. The cassette of claim 9, wherein the edge connector socket is configured to receive an edge-connected printed circuit card.

13. The cassette of claim 1, wherein the guide subassembly includes a first end having a first guide assembly fastener hole.

14. The cassette of claim 13, wherein the guide subassembly includes a second end having a second guide assembly fastener hole.

* * * * *